United States Patent [19]

Nakayama

[11] Patent Number: 5,434,749
[45] Date of Patent: Jul. 18, 1995

[54] HYBRID PRINTED CIRCUIT BOARD
[75] Inventor: Yoshiaki Nakayama, Shizuoka, Japan
[73] Assignee: Yazaki Corporation, Tokyo, Japan
[21] Appl. No.: 208,113
[22] Filed: Mar. 9, 1994
[30] Foreign Application Priority Data
  Apr. 1, 1993 [JP] Japan .................................. 5-075527
[51] Int. Cl.⁶ ............................................... H01R 9/00
[52] U.S. Cl. ..................................... 361/775; 361/749;
  174/261
[58] Field of Search .............................. 361/772–779,
  361/736, 785, 740, 747–748, 759, 760–761,
  749–751; 174/261–267

[56] References Cited
U.S. PATENT DOCUMENTS
3,803,458  4/1974  Morena, Jr. .
4,109,298  8/1978  Hanni et al. ........................ 361/784

*Primary Examiner*—Bot Ledynh
*Attorney, Agent, or Firm*—Armstrong, Westerman, Hattori, McLeland & Naughton

[57] ABSTRACT

This invention concerns a hybrid printed circuit board which permits easy and reliable connection between small-current circuit conductors and large-current circuit conductors. The hybrid printed circuit board of this invention comprises: an insulating substrate of synthetic resin having fixing bosses erected thereon; a flexible printed circuit sheet having small-current circuit conductors; and busbars as large-current circuit conductors; wherein the flexible printed circuit sheet is stacked and arranged on the insulating substrate so that the fixing bosses erected on the insulating substrate pass through and above the flexible printed circuit sheet, the busbars as large-current circuit conductors are put in contact with the small-current circuit conductors, and the fixing bosses are heated and deformed to fix the busbars in place.

3 Claims, 8 Drawing Sheets

HYBRID PRINTED CIRCUIT BOARD

BACKGROUND OF THE INVENTION

1. Field of the Invention

The present invention relates to a hybrid printed circuit board, which has circuit conductors to pass small signal currents and circuit conductors for large currents and which is incorporated in electric junction boxes used in automotive wiring harnesses.

2. Description of the Prior Art

Hybrid printed circuit boards having power circuits and signal circuits are generally made by bonding a thin copper foil for signal circuits to one side of an insulating substrate and a thick copper foil for power circuits to the other side and then etching these foils using mask patterns. In such printed circuit boards, because the thickness of the copper foil is limited by the depth that can be penetrated by etching, it is necessary to increase the conductor width in order to increase the current carrying capacity of the power circuit. This is turn makes it difficult to reduce the size of the circuit. Forming a through-hole in the power circuit conductors involves the step of forming a conductive layer on the inner surface of a hole piercing through the insulating substrate, as with the ordinary signal circuit conductors. With such through-holes, it is difficult to increase the thickness of the conductive layer, so that large currents cannot be carried.

Figure 16:
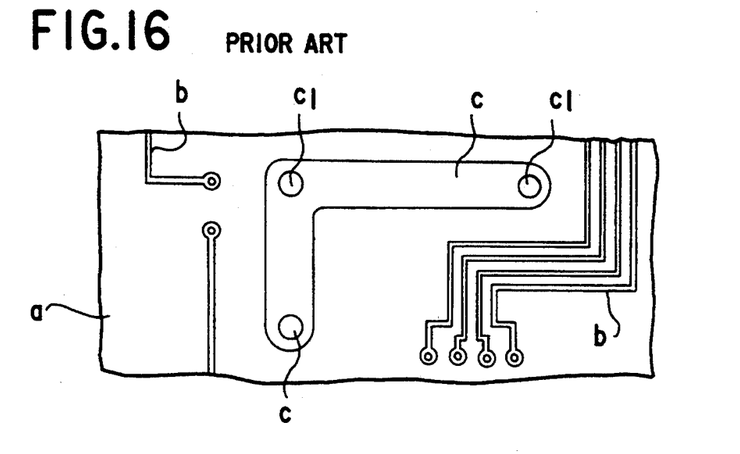
FIG. 16 is a plan view of a conventional printed circuit board.
Figure 17:
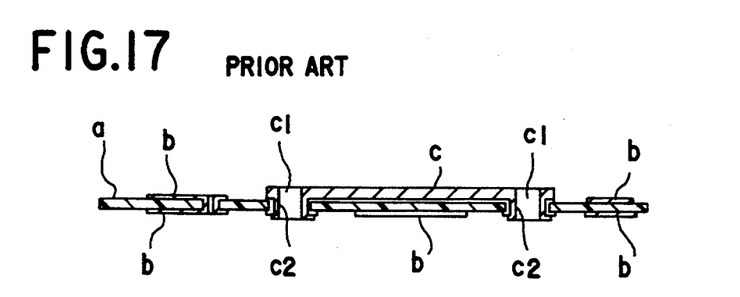
FIG. 17 is a cross section of the conventional printed circuit board of FIG. 16.
Figure 18:
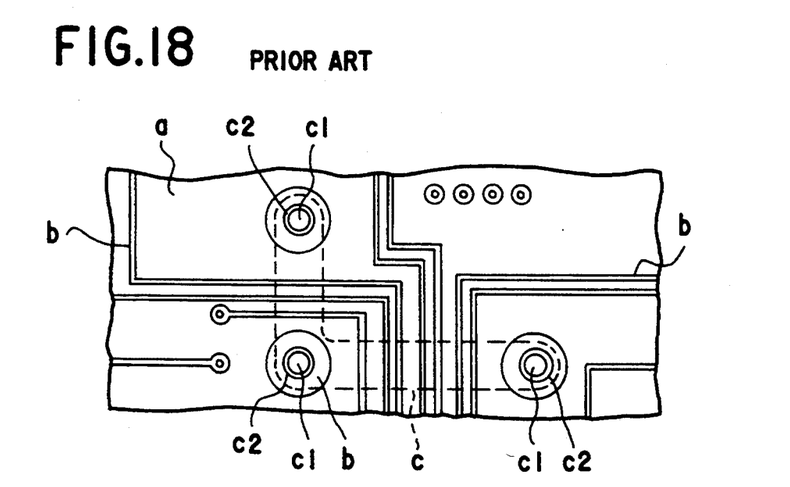
FIG. 18 is a back view of the conventional printed circuit board.

To cope with this problem, a hybrid printed circuit board as shown in FIGS. 16 through 18 has been proposed (Japanese Patent Preliminary Publication No. 63-237495). In this proposed hybrid printed circuit board with signal circuit conductors b and power circuit conductors c formed on an insulating substrate a, the signal circuit conductors b are made by pattern-etching a copper foil adhering to the substrate a and the power circuit conductors c are formed by fixing a desired pattern of a punched conductive metal sheet to the substrate a. Further, the through-hole portion c1 of the power circuit conductor c is formed by inserting a cylindrical projection c2 drawn from the circuit conductor c into the hole in the insulating substrate a.

This hybrid printed circuit board, too, requires a number of soldering steps, a proper material for soldering and sufficient heat resistance because terminals are soldered to the signal and power lead-out through-holes in the substrate.

SUMMARY OF THE INVENTION

The present invention has been accomplished to overcome the above-mentioned drawbacks and its objective is to provide a hybrid printed circuit board, which employs busbars as power circuit conductors and eliminates the need for soldering at the end of busbars and for through-holes, making the manufacture easy.

To achieve the above objective
The hybrid printed circuit board of this invention comprises:
- an insulating substrate of synthetic resin having fixing bosses erected thereon;
- a flexible printed circuit sheet having small-current circuit conductors; and
- busbars as large-current circuit conductors;
- wherein the flexible printed circuit sheet is stacked and arranged on the insulating substrate so that the fixing bosses erected on the insulating substrate pass through and above the flexible printed circuit sheet, the busbars as large-current circuit conductors are put in contact with the small-current circuit conductors, and the fixing bosses are heated and deformed to fix the busbars in place.

With this construction, the small-current circuit conductors and the busbars can be connected quickly and securely by placing the busbars in contact with the small-current circuit conductors and heating and deforming the fixing bosses of synthetic resin.

DETAILED DESCRIPTION OF PREFERRED EMBODIMENT

Figure 1:
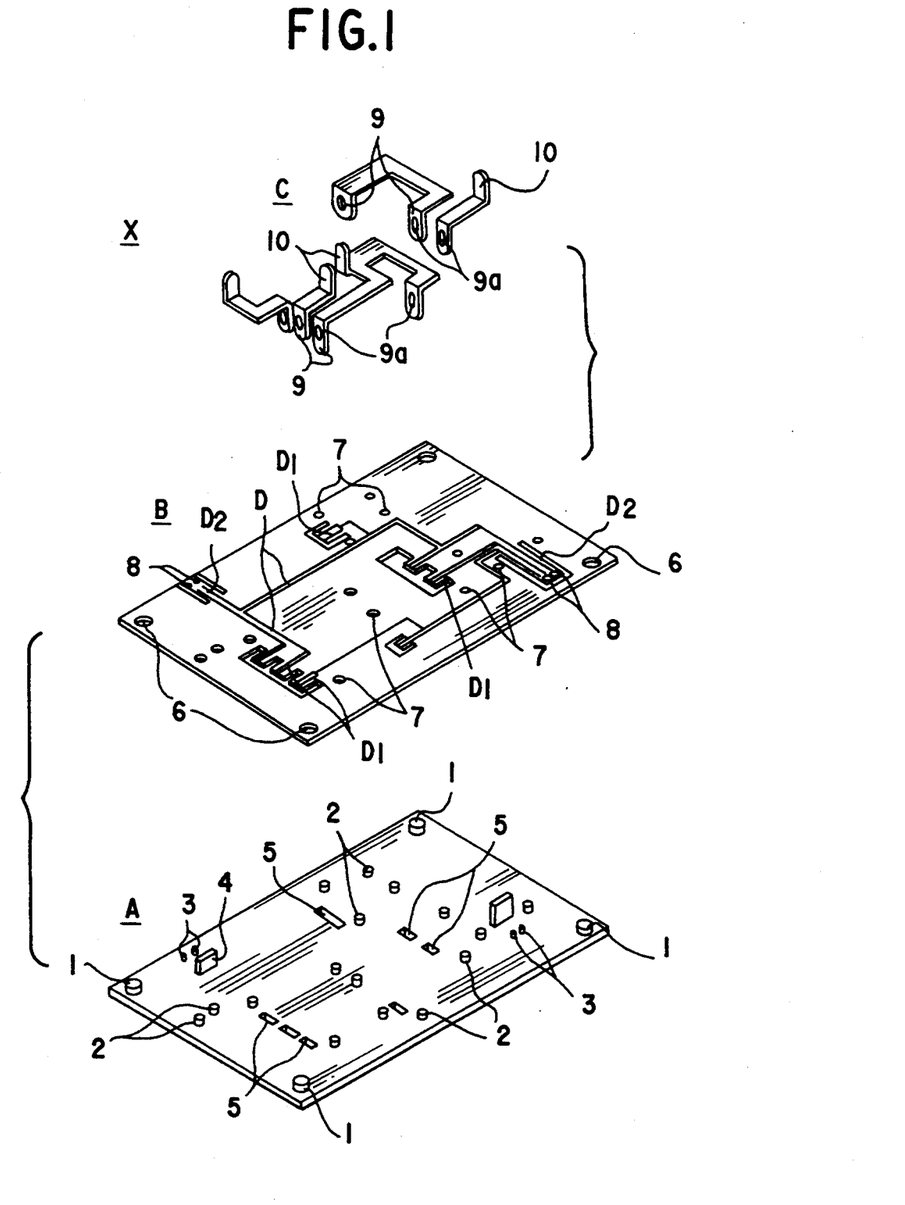
FIG. 1 is an exploded perspective view of one embodiment of this invention.

In the hybrid printed circuit board X of FIG. 1, symbol A represents an insulating substrate, B a flexible printed circuit sheet, and C a busbar as a power circuit conductor for carrying a large current.

The insulating substrate A of synthetic resin has erected thereon bosses 1 for fixing the flexible printed circuit sheet B, bosses 2 for fixing the busbar C and bosses 3 for fixing a connector portion described later. The substrate A is also formed with upright risers 4 for the flexible printed circuit sheet connection and with recesses 5 for electric circuit connection.

The flexible printed circuit sheet B is formed with insertion holes 6 for the insulating substrate fixing bosses 1, insertion holes 7 for the bosses 2 and insertion holes 8 for the bosses 3. It also has small-current circuit conductors for signals D formed thereon. The ends of the small-current circuit conductors D are formed with busbar connection patterns D1 and connector patterns D2, both of which have apart of their surrounding area of the sheet cut off so that the patterns can be bent easily.

The busbar C as the large-current circuit conductor has a connection tab 9 at one end thereof which is bent downward and at the other end a terminal portion 10 bent upward.

Figure 2:
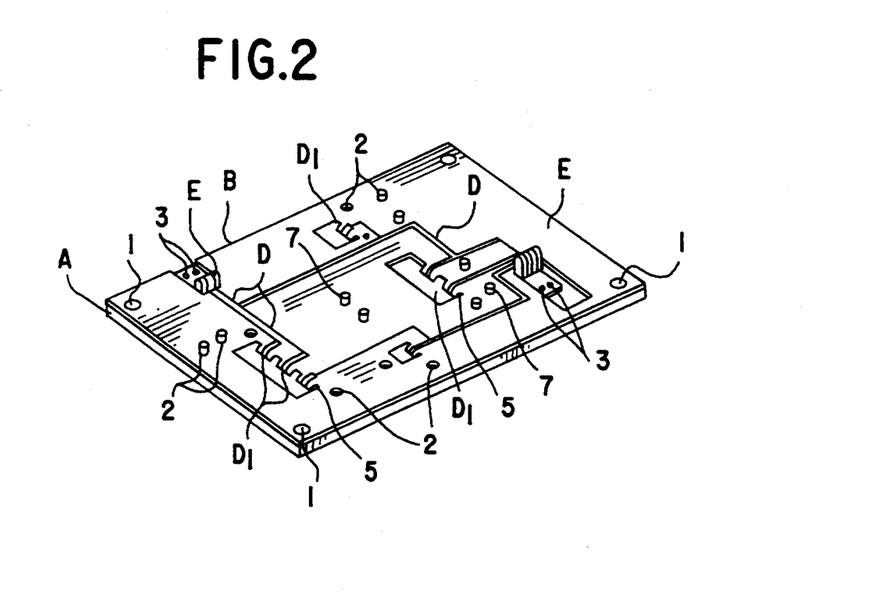
FIG. 2 is a perspective view of an intermediate product of the embodiment in which the insulating substrate is combined with a flexible printed circuit sheet.

The flexible printed circuit sheet B is assembled onto the insulating substrate A by engaging he insertion holes 6, 7 with the fixing bosses 1, 2. Then the heads of the fixing bosses 1 are fused by ultrasonic heating and pressurization to secure the flexible printed circuit sheet B to the insulating substrate A. The busbar connection patterns D1 at the end of the small-current conductors D are bent and inserted into the electric circuit connection recesses 5. The connector patterns D2 are bent upright along the risers 4 and then folded back down to engage the insertion holes 8 with the fixing bosses 3. The heads of the fixing bosses 3 are fused as mentioned earlier to fix the folded connector patterns D2, which are used as card edge type connectors E. (See FIG. 2.)

Figure 3:
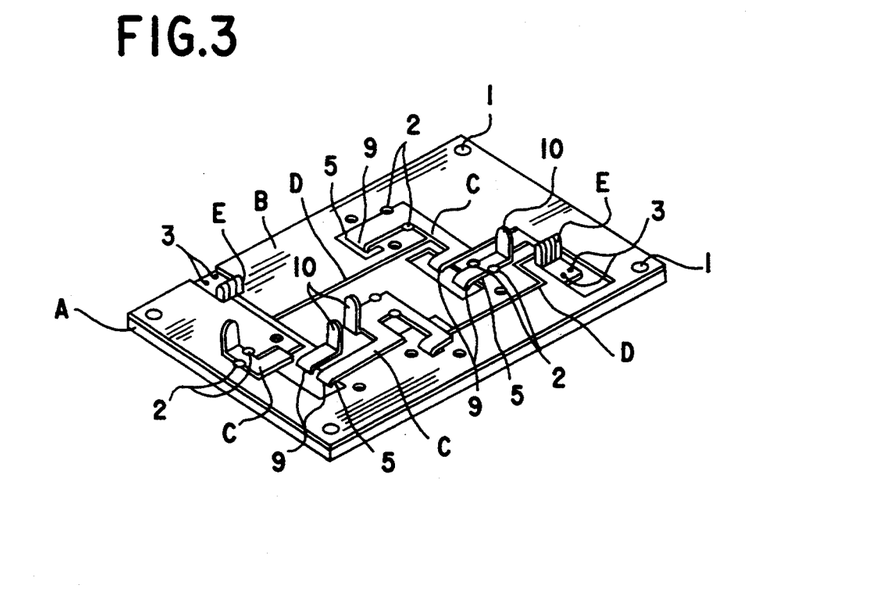
FIG. 3 is a perspective view of a hybrid printed circuit board of the embodiment with all components assembled.
Figure 4:
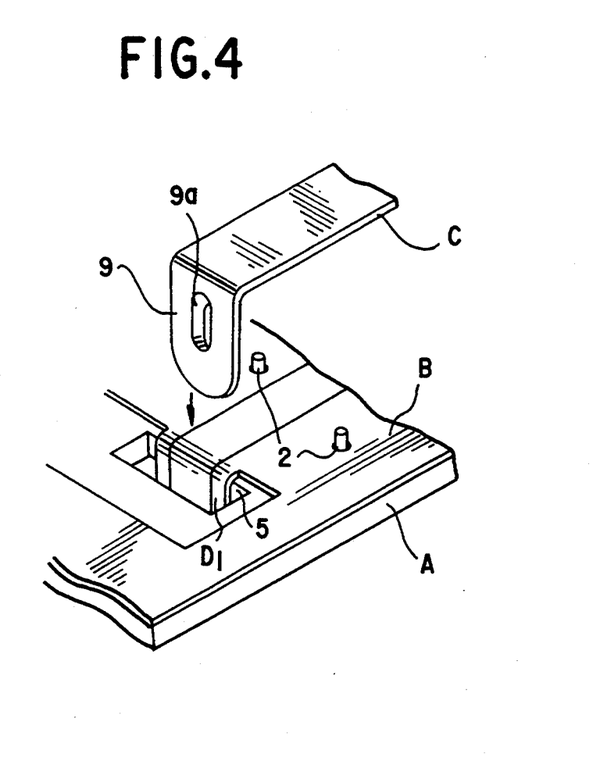
FIG. 4 is an exploded perspective view showing a busbar connection structure in the embodiment.
Figure 5:
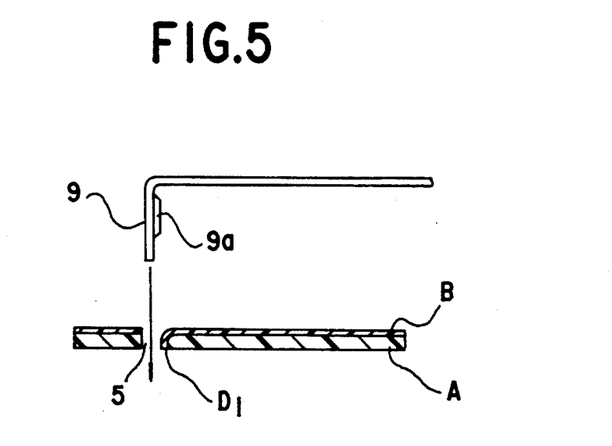
FIG. 5 is an exploded side cross section showing a busbar connection structure in the embodiment.

Further, the connection tabs 9 of the busbar C are inserted into the electric circuit connection recesses 5 in the insulating substrate A to come into contact with the busbar connection pattern D1 of the flexible printed circuit sheet. With the busbar C arranged between the specified fixing bosses 2, the heads of the fixing bosses 2 are fused to securely fix the busbar C (see FIG. 3). The connection tab 9 is provided with a contact projection 9a, which is formed by drawing (see FIG. 4), to ensure a good electrical connection with the busbar connection pattern D1.

Figure 6:
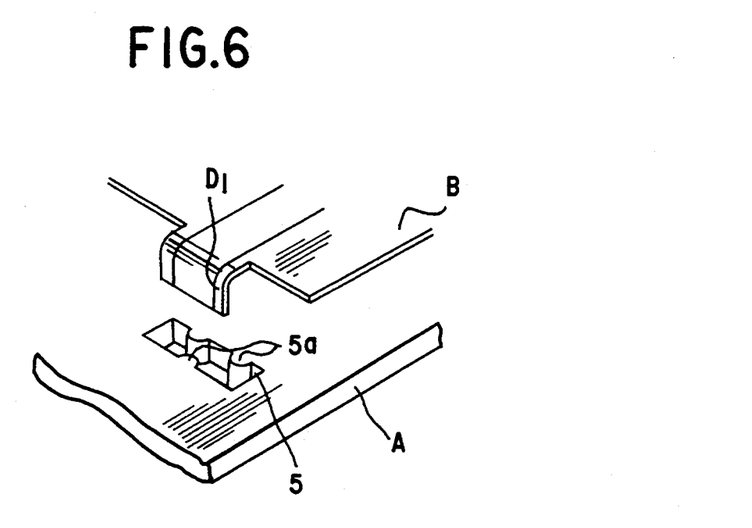
FIG. 6 is an exploded perspective view of another example of a busbar connection structure.
Figure 7:
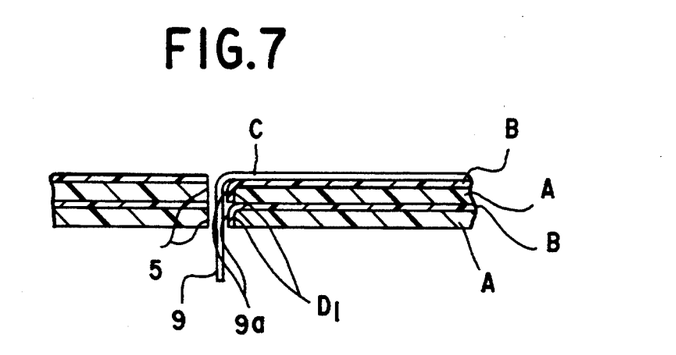
FIG. 7 is a side cross section of another example of a busbar connection structure.
Figure 8:
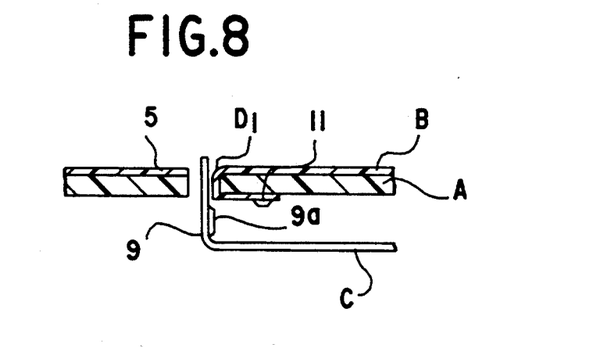
FIG. 8 is a side cross section of another example of a busbar connection structure.

The electric circuit connection recess 5 in the insulating substrate A may be formed with projections 5a on its inner surface to provide a more reliable electric connection between the busbar connection pattern D1 and the connection tab 9 (see FIG. 6). The connection tab 9, which is formed somewhat long, may be provided with two contact projections 9a, 9a so that a layer-to-layer connection can be made between the busbar connection patterns D1, D1 of the flexible printed circuit sheets B, B on the stacked insulating substrates A, A (see FIG. 7). The busbar connection pattern D1 may be folded beneath the back of the insulating substrate A and fixed by the fixing bosses 1, 1 to allow the recess 5 to be used as the conventional through-hole (see FIG. 8).

Figure 9:
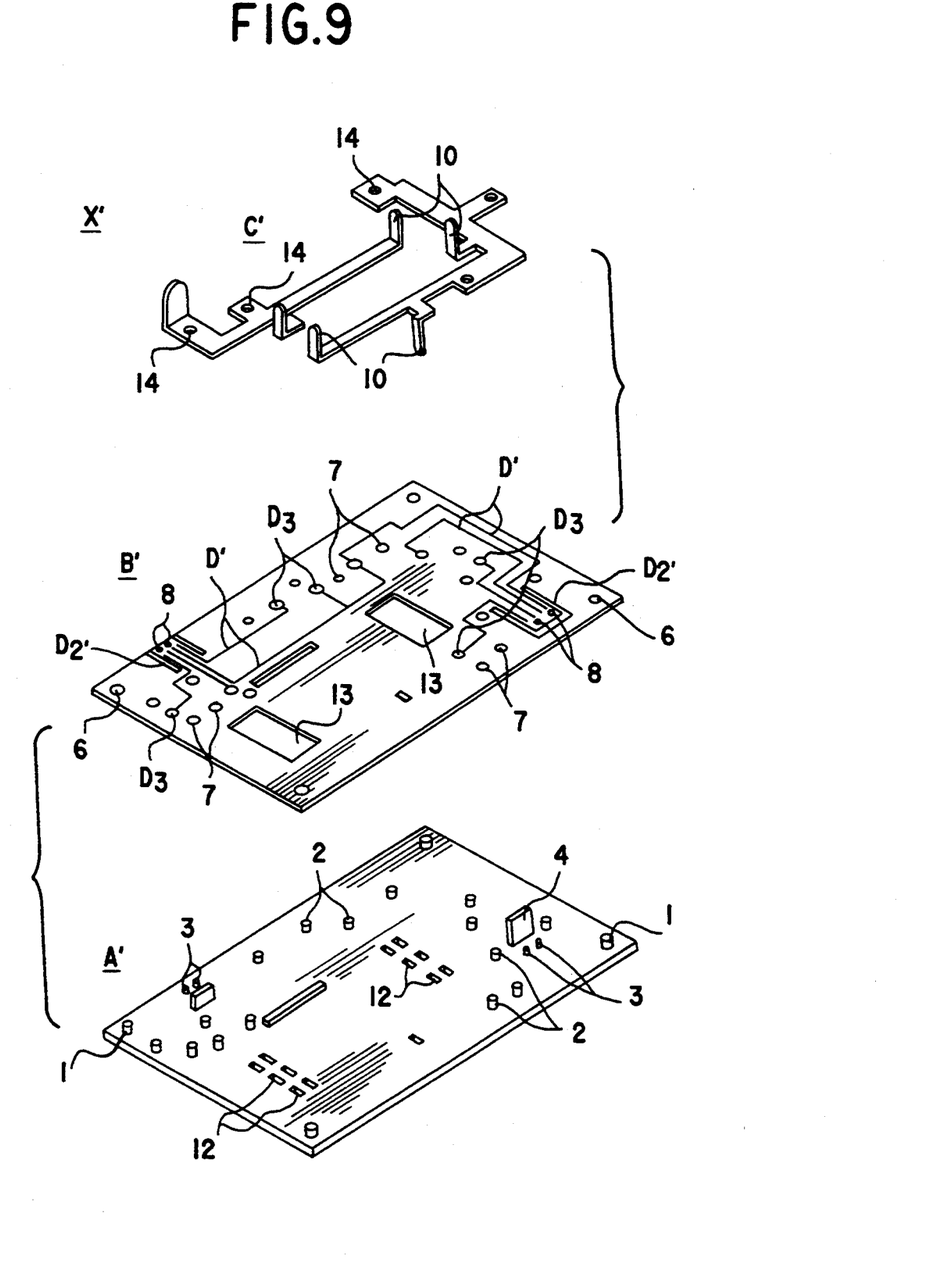
FIG. 9 is an exploded perspective view of a second embodiment of this invention.

In a hybrid printed circuit board X' of FIG. 9, symbol A' represents an insulating substrate, B' a flexible printed circuit sheet, and C' a busbar as the large-current circuit conductor.

The insulating substrate A' of synthetic resin has erected thereon bosses 1 for fixing the flexible printed circuit sheet B', bosses 2 for fixing the busbar C' and bosses 3 for fixing a connector portion. The substrate A' is also formed with upright risers 4 for the flexible printed circuit sheet connection and with busbar terminal holes 12.

The flexible printed circuit sheet B is formed with insertion holes 6 for the insulating substrate fixing bosses 1, insertion holes 7 for the bosses 2 and insertion holes 8 for the bosses 3. It also has busbar terminal group insertion holes 13 and small-current circuit conductors D'. Some ends of the small-current circuit conductors D' are formed with connector patterns D2', which have a part of their surrounding area of the sheet cut away so that the patterns can be bent easily. Other ends and intermediate portions of the small-current circuit conductors D' are formed with busbar connection lands D3.

The busbar C' has contact projections 14 on its underside, which are formed by drawing. The ends of the busbar C' are bent up or down to form terminal portions 10.

Figure 10:
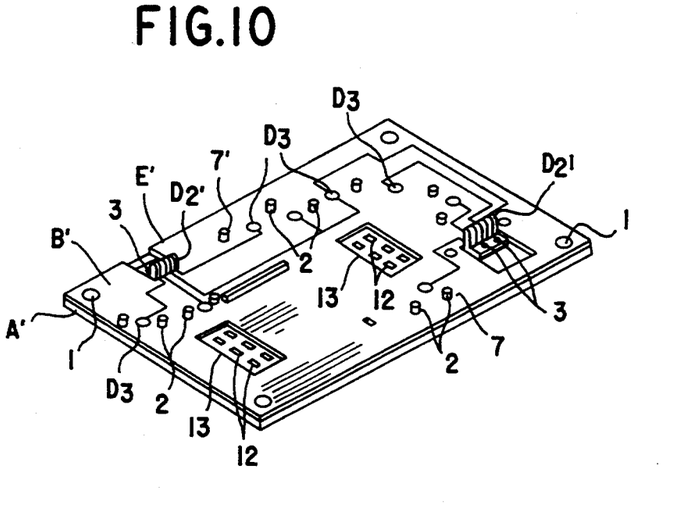
FIG. 10 is a perspective view of an intermediate product of the second embodiment in which the insulating substrate is combined with a flexible printed circuit sheet.

The flexible printed circuit sheet B' is assembled onto the insulating substrate A' by engaging the insertion holes 6, 7 with the fixing bosses 1, 2. Then the heads of the fixing bosses 1 are fused by ultrasonic heating and pressurization, as mentioned above, to secure the flexible printed circuit sheet B' to the insulating substrate A'. The connector patterns D2' are bent upright along the risers 4 and then folded back down to engage the insertion holes 8 with the fixing bosses 3. The heads of the fixing bosses 3 are fused to fix the folded connector patterns D2', which are sued as card edge type connectors E'. (See FIG. 10.)

Figure 11:
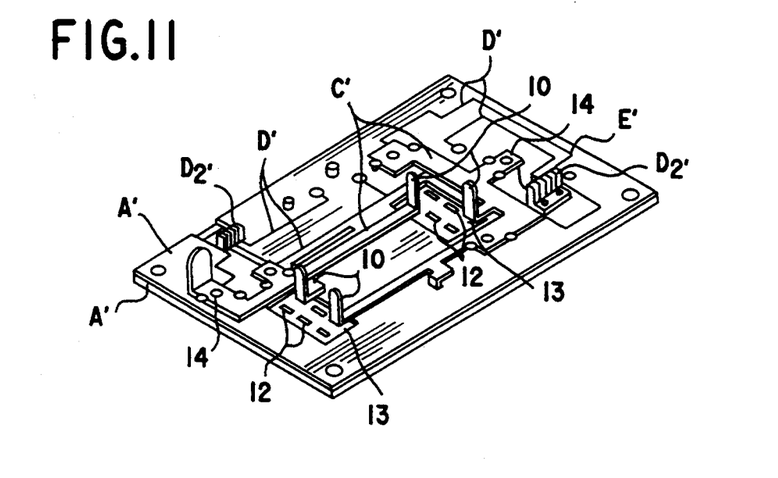
FIG. 11 is a perspective view of a hybrid printed circuit board of the second embodiment with all components assembled.
Figure 12:
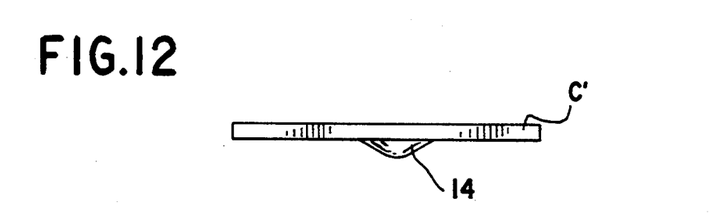
FIG. 12 is a side view of the busbar in the second embodiment.
Figure 13:
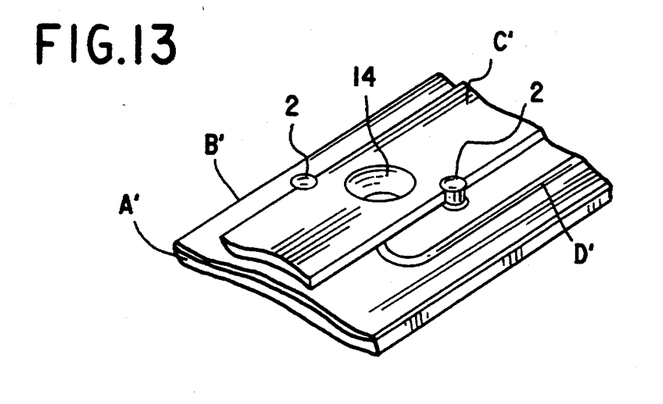
FIG. 13 is a perspective view of a busbar connection structure in the second embodiment.
Figure 14:
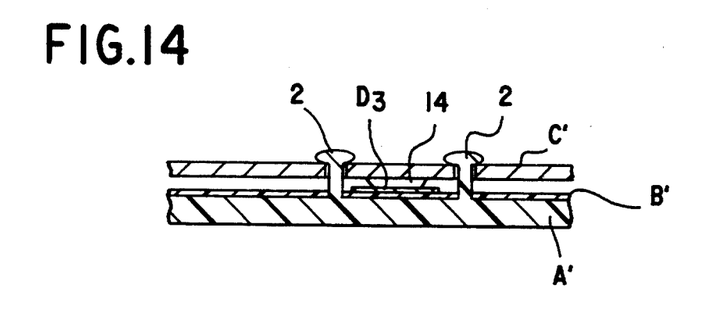
FIG. 14 is a side cross section of the busbar connection structure in the second embodiment.

Next, the busbar C' is mounted on the flexible printed circuit sheet B' in such a way that the contact projections 14 are in contact with the busbar connection lands D3 of the small-current circuit conductors D' located between the specified fixing bosses 2. The heads of the bosses 2 are fused to fix the busbars, providing a good electrical connection between the busbars C' and the busbar connection lands D3 (see FIGS. 11, 12 and 14). Now, the large-current circuit conductors in the form of the busbars C' are combined with the small-current circuit conductors D'.

Figure 15:
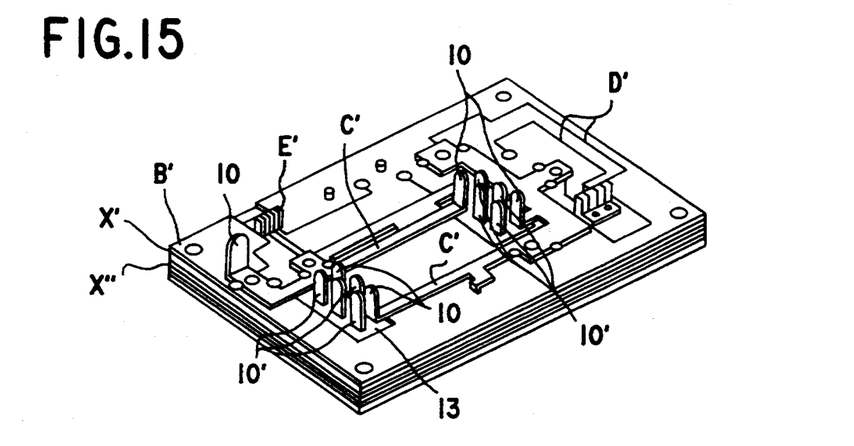
FIG. 15 is a perspective view showing hybrid printed circuit boards stacked together.

The hybrid printed circuit board X' is stacked on another hybrid printed circuit board X". The terminal portions 10' of the busbars on the lower hybrid printed circuit board X" pass through the busbar terminal holes 12 to rise above the upper hybrid printed circuit board X', forming the connector terminal group along with the terminal portions 10 of the upper hybrid printed circuit board.

Structural features and advantages may be summarized as follow. The flexible printed circuit sheet having small-current circuit conductors is stacked on the synthetic resin insulating substrate so that the erect fixing bosses on the insulating substrate are passed through and above the flexible printed circuit sheet. Then, the busbars as the large-current circuit conductors are placed in contact with the small-current circuit conductors and fixed in place by heating and deforming the fixing bosses. This construction eliminates the need for cumbersome processes, such as making through-holes and performing a soldering work, and ensures easy and reliable connection between the small-current circuit conductors and the large-current circuit conductors. Since busbars are employed as the large-current circuit conductors, it is possible to easily cope with a variety of large-current circuit designs.

What is claimed is:
1. A hybrid printed circuit board comprising:
   an insulating substrate of synthetic resin having fixing bosses erected thereon;
   a flexible printed circuit sheet having first circuit conductors for conducting a current; and busbars as second circuit conductors for conducting a current larger than the current of said first conductors;

wherein said hybrid printed circuit board is constructed such that said flexible printed circuit sheet is stacked and arranged on the insulating substrate so that said fixing bosses erected on the insulating substrate pass through and above said flexible printed circuit sheet, said busbars are put in contact with the first circuit conductors, and said fixing bosses are heated and deformed to fix the busbars in place.

2. A hybrid printed circuit board according to claim 1, wherein said insulating substrate is formed with electric circuit recesses, said first circuit conductors are formed at their ends with busbars connection patterns whose surrounding areas are partly cut and removed, and said busbars are formed at their ends with connection tabs which are bent and inserted into said electric circuit connection recesses, wherein said connection tabs are forced into pressure contact with said busbars connection patterns of the first circuit conductors.

3. A hybrid printed circuit board according to claim 1, wherein said first circuit conductors are formed with busbar connection lands, and the busbars are formed with contact projections, wherein said contact projections of the busbars are pressed against said busbar connection lands when the busbars are mounted on the flexible printed circuit sheet.

* * * * *